United States Patent
Kondou

(10) Patent No.: US 8,456,203 B2
(45) Date of Patent: Jun. 4, 2013

(54) MULTIPHASE CLOCK GENERATION CIRCUIT

(75) Inventor: Masafumi Kondou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 102 days.

(21) Appl. No.: 13/224,097

(22) Filed: Sep. 1, 2011

(65) Prior Publication Data

US 2012/0056644 A1    Mar. 8, 2012

(30) Foreign Application Priority Data

Sep. 7, 2010   (JP) ................. 2010-200174

(51) Int. Cl.
*H03K 21/00* (2006.01)
*H03K 23/00* (2006.01)
*H03K 25/00* (2006.01)

(52) U.S. Cl.
USPC ............. 327/115; 327/41; 327/113; 327/291; 327/295; 377/47; 377/48

(58) Field of Classification Search
USPC ............. 327/41, 113, 115, 291, 295; 377/47, 377/48
See application file for complete search history.

(56) References Cited

U.S. PATENT DOCUMENTS

| | | | |
|---|---|---|---|
| 6,407,597 B1 | 6/2002 | Ishiwaki | |
| 7,113,009 B2 * | 9/2006 | Sun et al. | 327/115 |
| 8,004,320 B2 * | 8/2011 | Yang | 327/117 |
| 2002/0070776 A1 | 6/2002 | Ishiwaki | |
| 2006/0132213 A1 * | 6/2006 | Suzuki | 327/291 |
| 2008/0191752 A1 * | 8/2008 | Austin et al. | 327/115 |
| 2012/0262207 A1 * | 10/2012 | Burcea | 327/115 |

FOREIGN PATENT DOCUMENTS

| | | |
|---|---|---|
| JP | 2002-176354 A | 6/2002 |
| JP | 2008-124966 A | 5/2008 |

OTHER PUBLICATIONS

ISSCC 2001: 10.4 "A 1.75GHz Highly-Integrated Narrow-Band CMOS Transmitter with Harmonic-Rejection Mixers", Jan. 1, 2001, IEEE International Solid-State Circuits Conference.
ISSCC 2006: 26.6 "An 800MHz to 5GHz Software-Defined Radio Receiver in 90nm CMOS", Jan. 1, 2006, IEEE International Solid-State Circuits Conference, pp. 480-481 and 667.

\* cited by examiner

*Primary Examiner* — John Poos
(74) *Attorney, Agent, or Firm* — Arent Fox LLP

(57) ABSTRACT

A multiphase clock generation circuit includes: a first frequency divider to generate a first intermediate clock and a second intermediate clock; a second frequency divider to generate output clocks of a first group including a first output clock and a second output clock; a third frequency divider to generate output clocks of a second group including a third output clock and a fourth output clock; a selector to supply one of the second intermediate clock and a value to the third frequency divider in response to a switching signal; an error detection circuit to detect an error in a phase relationship between the output clock of the first group and the output clock of the second group; and a re-reset circuit to output the switching signal to the selector based on the error.

17 Claims, 14 Drawing Sheets

MULTIPHASE CLOCK GENERATION CIRCUIT

CROSS-REFERENCE TO RELATED APPLICATIONS

This application claims the benefit of priority from Japanese Patent Application No. 2010-200174 filed on Sep. 7, 2010, the entire contents of which are incorporated herein by reference.

BACKGROUND

1. Field

The embodiments discussed herein relate to a multiphase clock generation circuit.

2. Description of Related Art

The multiphase clock generation circuit generates a multiphase clock from a reference clock. For example, the multiphase clock generation circuit may be embedded in the wireless communication device.

Related art is disclosed in Japanese Unexamined Patent Application Publication No. 2002-176354, Japanese Unexamined Patent Application Publication No. 2008-124966, a nonpatent literature ISSCC 2001: 10.4 "A 1.75 GHz Highly-Integrated Narrow-Band CMOS Transmitter with Harmonic-Rejection Mixers", a non-patent literature ISSCC 2006: 26.6 "An 800 MHz to 5 GHz Software-Defined Radio Receiver in 90 nm CMOS", and the like.

SUMMARY

According to one aspect of the embodiments, a multiphase clock generation circuit includes: a first frequency divider to generate a first intermediate clock and a second intermediate clock in synchronization with a reference clock; a second frequency divider to generate output clocks of a first group including a first output clock and a second output clock in synchronization with the first intermediate clock; a third frequency divider to generate output clocks of a second group including a third output clock and a fourth output clock in synchronization with the second intermediate clock; a selector, provided between the first frequency divider and the third frequency divider, to supply one of the second intermediate clock and a value to the third frequency divider in response to a switching signal; an error detection circuit to detect an error in a phase relationship between the output clock of the first group and the output clock of the second group when the switching signal indicates a first mode; and a re-reset circuit to output the switching signal to the selector based on the error in asynchronous with the reference clock.

Additional advantages and novel features of the invention will be set forth in part in the description that follows, and in part will become more apparent to those skilled in the art upon examination of the following or upon learning by practice of the invention.

DESCRIPTION OF EMBODIMENTS

In a high-frequency circuit within a wireless communication device, a received high-frequency signal is mixing using a clock, and a reception signal having an intermediate frequency or a reception baseband signal is generated. An I channel and a Q channel of a down-convert mixer use clocks having different phases each other by 90 degrees. When clocks are differential clocks, clocks whose phases are 0 degrees and 180 degrees are used as an I channel clock, and clocks whose phases are 90 degrees and 270 degrees are used as a Q channel clock.

A clock generation circuit in the high-frequency circuit generates multiphase clocks whose phases are 0 degrees, 90 degrees, 180 degrees, and 270 degrees, respectively. The clock generation circuit includes a 1/2 frequency divider for dividing a frequency of a differential reference clock.

In the wireless communication device, according to a reception frequency band, a 4-phase clock is generated or an 8-phase clock is generated based on a clock. For example, a harmonic-rejection mixer circuit mixes the 8-phase clock and a reception signal, and causes the reception signal to pass through a low-pass filter. The reception signal having a frequency which is three times or five times frequency of a desired wave may be demodulated. A clock generation circuit, which generates an 8-phase clock and has a large, may be used as needed.

Figure 1:
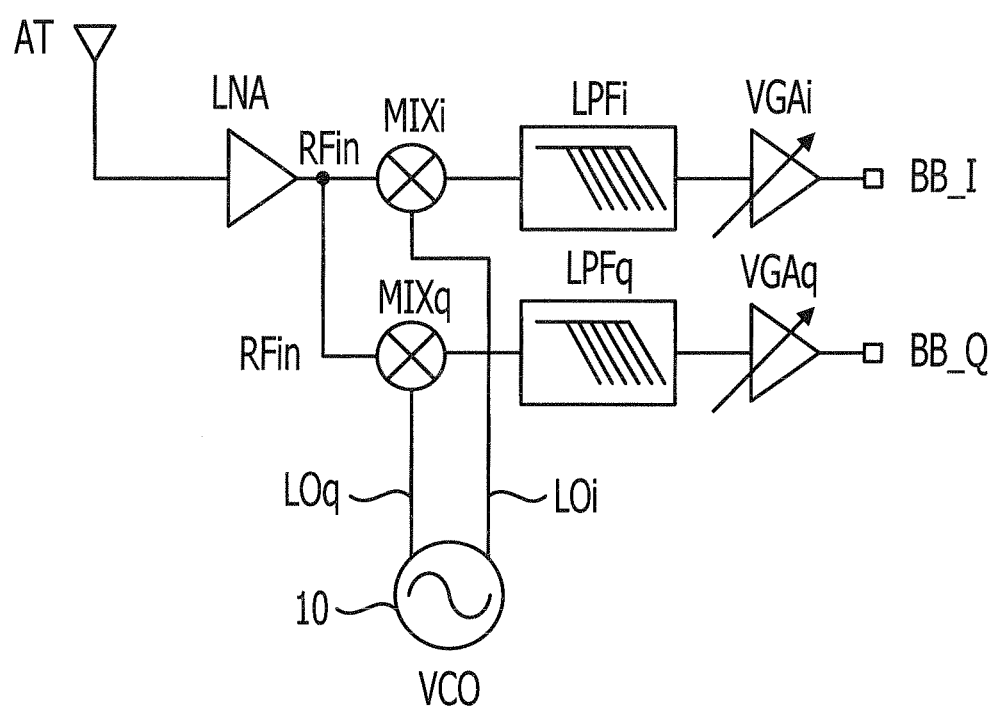
FIG. 1 illustrates an exemplary wireless communication device.

FIG. 1 illustrates an exemplary wireless communication device. The wireless communication device illustrated in FIG. 1 may include a multiphase clock generation circuit. A receiving device illustrated in FIG. 1 may include a high-frequency circuit. The receiving device includes a low noise amplifier LNA for amplifying a high-frequency reception signal received by a reception antenna AT, mixer circuits MIXi and MIXq for multiplying the amplified reception signal RFin by clocks LOi and LOq, respectively, low-pass filters LPFi and LPFq for passing low-frequency signals of the outputs of the mixer circuits, and variable-gain amplifiers VGAi and VGAq for amplifying the outputs of the low-pass filters to certain amplitudes. Baseband signals BB_I and BB_Q of an I signal and a Q signal from the variable-gain amplifiers, are supplied to a subsequent-stage digital baseband circuit not illustrated, and are demodulated or decoded.

The clock LOi and LOq may be high-frequency clock signals whose phases are out of phase with each other by 90 degrees/2). A clock generation circuit 10 divides the frequency of a reference clock generated by a VCO not illustrated, and generates the clocks LOi and LOq whose phases are out of phase with each other by 90 degrees. When the mixer circuits operate in a differential manner, the clock generation circuit 10 generates the differential clock LOi whose phases are 0 degrees and 180 degrees and the differential local clock LOq whose phases are 90 degrees and 270 degrees.

When the frequency of the reception signal RFin is set to fin and the frequencies of the clocks LOi and LOq are set to fl, the mixer circuits MIXi and MIXq and the low-pass filters LPFi and LPFq output signals having a frequency fin-fl. The frequency fl may be set to substantially the same frequency as or a similar frequency to the frequency fin of a desired wave, or a frequency corresponding to the frequency fin of the desired wave. Since the clocks LOi and LOq are rectangle waves, the clock may include the component of a third-order frequency 3fin or a fifth-order frequency 5fin in addition to the component of the frequency fin of the desired wave. When the clock includes the third-order frequency component 3fin or the fifth-order frequency component 5fin, the mixer circuit and the low-pass filter may output a signal having a frequency fin-fl, a signal having a frequency 3fin-3fl, and a signal having a frequency 5fin-5fl.

When an interfering wave having the frequency 3fin or 5fin in addition to the desired wave of the frequency fin, the output signal of the mixer circuit and the low-pass filter may include a signal including the frequency 3fin-3fl or 5fin-5fl in addition to the signal of the frequency fin. Since the signal of the desired wave includes the interfering wave, the reception signal may not be normally demodulated or decoded.

Figure 2A:
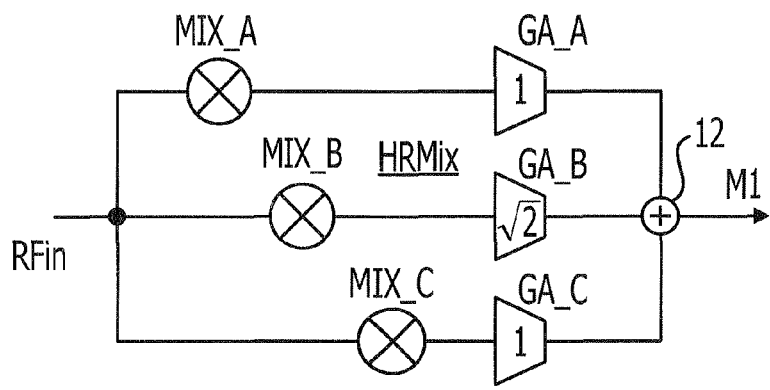
FIG. 2A illustrates an exemplary harmonic-rejection mixer circuit.

FIG. 2A illustrates an exemplary harmonic-rejection mixer circuit. A harmonic-rejection mixer circuit HRMix includes first to third multipliers MIX_A, MIX_B, and MIX_C that multiply the input signal RFin by first to third 8-phase signals CK0, CK45, and CK90, respectively, first to third gain adjustment circuits GA_A, GA_B, and GA_C that perform gain adjustment on the outputs of the first to third multipliers MIX_A, MIX_B, and MIX_C with a ratio of $1:\sqrt{2}:1$, and an adder 12 that adds the outputs of the gain adjustment circuits.

Figure 2B:
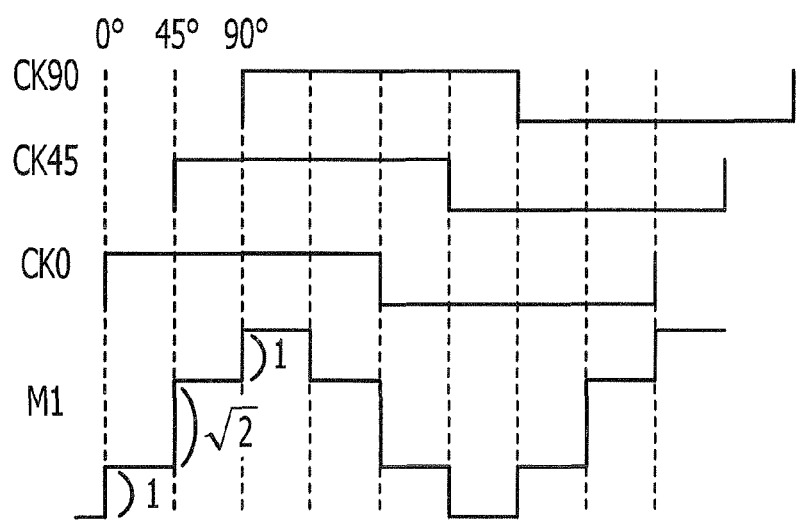
FIG. 2B illustrates an exemplary operation waveform of a harmonic-rejection mixer circuit.

FIG. 2B illustrates an exemplary operation waveforms of a harmonic-rejection mixer circuit. The operation waveforms illustrated in FIG. 2B may be the operation waveforms of the harmonic-rejection mixer circuit illustrated in FIG. 2A. In FIG. 2B, an input signal RFin having a 1 (HIGH) level is input. The phases of the first to the third 8-phase signals CK0, CK45, and CK90 may be 0 degrees, 45 degrees, and 90 degrees, respectively. When the input signal RFin is "1", the outputs of the multipliers MIX_A, MIX_B, and MIX_C may be the first to third 8-phase signals CK0, CK45, and CK90. When the gains of the gain adjustment circuits GA_A, GA_B, and GA_C are adjusted with the ratio of $1:\sqrt{2}:1$, a level variation may occur 6 times during a cycle in a signal M1 obtained by addition may occur 6 times during a cycle, as illustrated in the figure. The ratio of the level variation may be $1:\sqrt{2}:1:1:\sqrt{2}:1$. The shape of the output signal M1 may be similar to a sine wave.

Figure 2C:
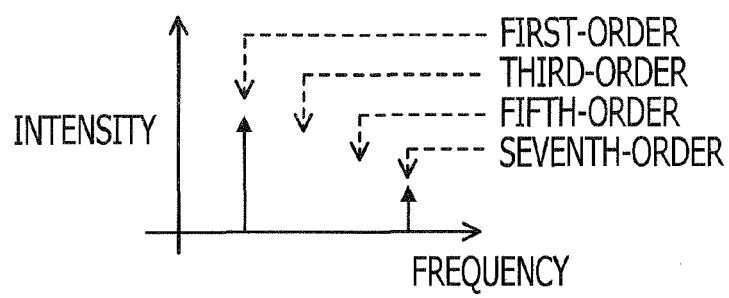
FIG. 2C illustrates an exemplary spectrum of an output signal.

FIG. 2C illustrates an exemplary spectrum of an output signal. The spectrum illustrated in FIG. 2C may be the spectrum of the output signal M1 of the harmonic-rejection mixer circuit illustrated in FIG. 2A. While the frequency spectrum of the output signal M1 includes the first-order high-frequency wave components and harmonic components of the frequency signals of the 8-phase signals CK0, CK45, and CK90, the third-order and the fifth-order harmonic components may be removed.

The harmonic-rejection mixer circuit HRMix may be substantially equivalent to or similar to a multiplier that multiplies the input signal RFin by a signal having the shape of the output signal M1 illustrated in FIG. 2B.

For example, when the harmonic-rejection mixer circuit illustrated in FIG. 2A is applied to the mixer circuits MIXi and MIXq illustrated in FIG. 1, no signal including the frequency 3fin-3fl or 5fin-5fl may be output from the low-pass filters LPFi and LPFq since the clock signals LOi and LOq, which do not include a frequency component whose frequency is triple or quintuple frequency of the desired wave, are mixed. Therefore, a frequency component corresponding to the frequency 3f triple frequency of the desired wave or the frequency 5f quintuple frequency of the desired wave may be removed from the output of a detection circuit including the mixer circuit and the low-pass filter in the wireless transceiver circuit.

For example, when a frequency triple the frequency of terrestrial digital broadcasting overlaps with the frequency band of a mobile phone, a detection circuit in a terrestrial digital broadcasting tuner embedded in the mobile phone may not extract the reception signal of the mobile phone. When the 8-phase clock signal is generated and supplied to the harmonic-rejection mixer circuit, the consumption current of the 8-phase clock generation circuit may increase. Therefore, for example, when a ratio between the reception frequency of the terrestrial digital broadcasting and the reception frequency of the mobile phone is not 1:3, clocks CK45, CK135, CK224, and CK315 may not be generated, and clocks CK0, CK90, CK180, and CK270 may be generated. The clock generation circuit may be switched between an 8-phase mode and a 4-phase mode. In addition, when the 8-phase clock is used, the 8-phase mode may be set, and when the 8-phase clock is not used, the 4-phase mode may be set.

When a phase id mixed a clock whose phase is 90 degrees, the first to third multipliers MIX_A, MIX_B, and MIX_C in the harmonic-rejection mixer circuit illustrated in FIG. 2A multiply the input signal RFin by the first to third 8-phase signals CK90, CK135, and CK180, respectively.

Figure 3:
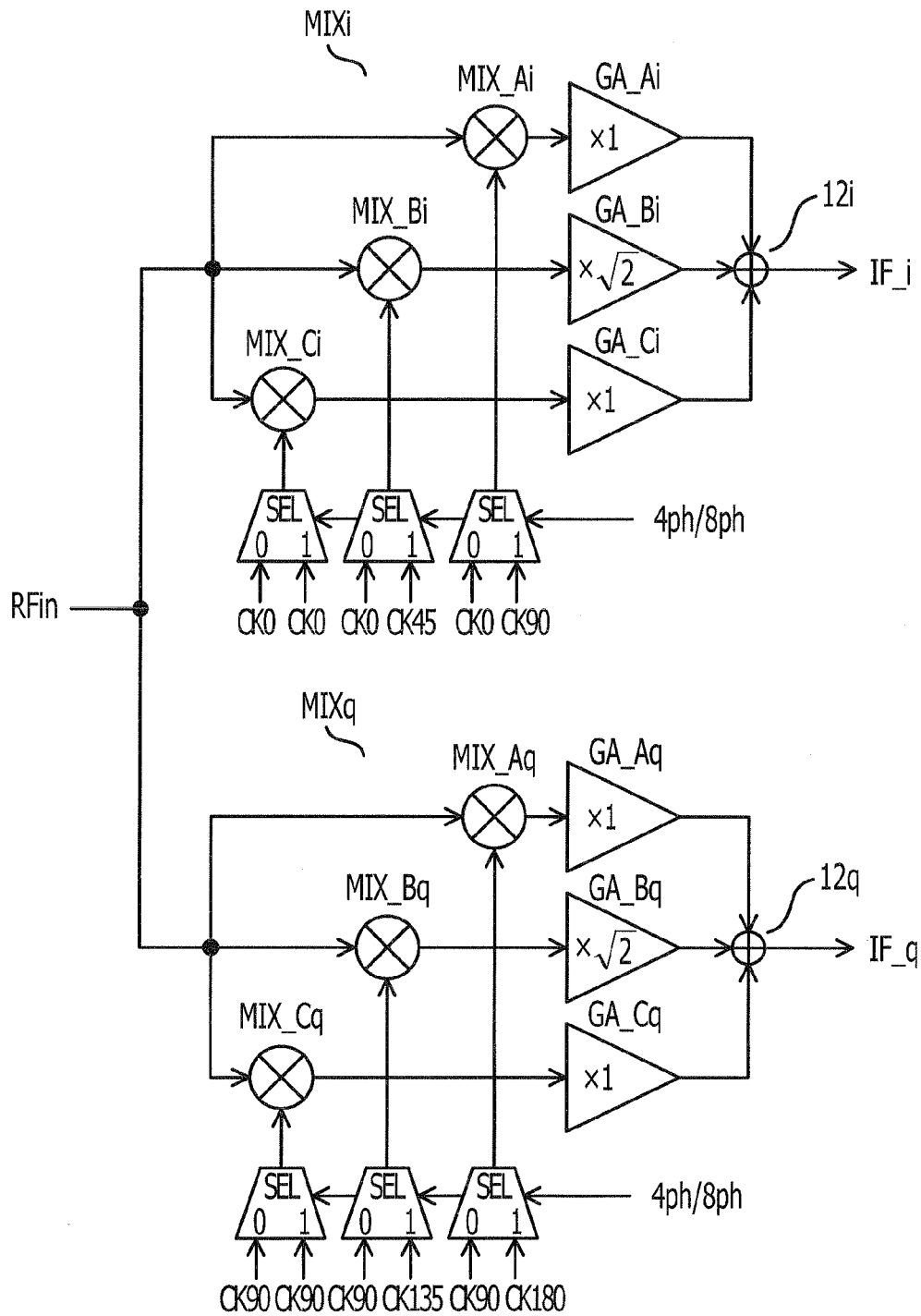
FIG. 3 illustrates an exemplary mixer circuit.

FIG. 3 illustrates an exemplary mixer circuit. A mixer circuit illustrated in FIG. 3 may be the mixer circuit of the wireless receiving device illustrated in FIG. 1. The harmonic-rejection mixer circuit illustrated in FIG. 2A may be applied to the mixer circuits MIXi and MIXq in FIG. 1. In the mixer circuit MIXi on an I channel side illustrated in FIG. 3, "i" is assigned to the ends of the citation numbers of three mixers, three gain adjustment circuits, and an adder. When a 4-hase/8-hase switching signal 4ph/8ph is "0" indicating the 4-phase mode, three selectors SEL select the clock CK0, and when the 4-hase/8-hase switching signal 4ph/8ph is "1" indicating the 8-phase mode, the three selectors SEL select the three clocks CK0, CK45, and CK90. The mixer circuit may receive a single-phase signal. When the mixer circuit receives a differential signal, the clock CK0/CK180 is selected in the 4-phase mode, and the clocks CK0/CK180, CK45/CK225, and CK90/CK270 are selected in the 8-phase mode.

In the mixer circuit MIXq on a Q channel side, "q" is assigned to the ends of the citation numbers. When the 4-hase/8-hase switching signal 4ph/8ph is "0" indicating the 4-phase mode, three selectors SEL select the clock CK90, and when the 4-hase/8-hase switching signal 4ph/8ph is "1" indicating the 8-phase mode, the three selectors SEL select the three clocks CK90, CK135, and CK180. The mixer circuit may receive a single-phase signal. When the mixer circuit receives a differential signal, the clock CK90/CK270 is selected in the 4-phase mode, and the clocks CK90/CK270, CK135/CK315, and CK180/CK0 are selected in the 8-phase mode.

Figure 4:
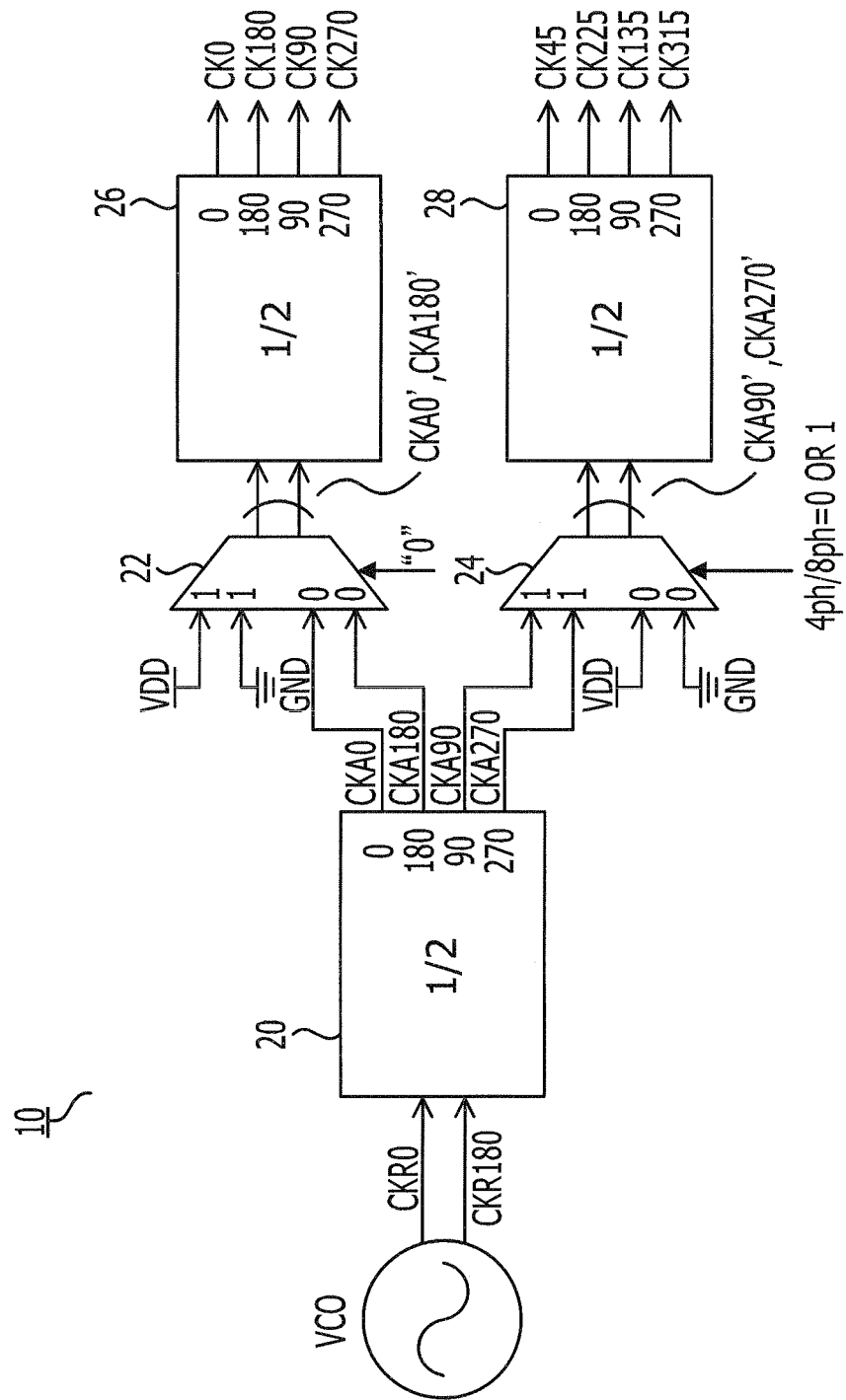
FIG. 4 illustrates an exemplary clock generation circuit.

FIG. 4 illustrates an exemplary clock generation circuit. The clock generation circuit includes a voltage-controlled oscillator VCO that generates differential reference clocks CKR0 and CKR180 and a first frequency divider 20 that 1/2-frequency-divides the reference clocks CK0 and CK180 to generate 4-phase intermediate clocks CKA0, CKA90, CKA180, and CKA270 whose frequencies are half the frequency of the reference clock. The phases of the intermediate clocks may have a relationship of 0, 90, 180, and 270 degrees.

The clock generation circuit includes a second frequency divider 26 that 1/2-frequency-divides the clocks CKA0 and CKA180 from among the 4-phase clocks CKA0 to CKA270, whose phases are 0 degrees and 180 degrees, and generates 4-phase clocks CK0, CK90, CK180, and CK270 having half the frequencies, and a third frequency divider 28 that 1/2-frequency-divides the clocks CKA90 and CKA270 from among the 4-phase clocks CKA0 to CKA270, whose phases are 90 degrees and 270 degrees, and generates 4-phase clocks CK45, CK135, CK225, and CK315 having half the frequencies. The second frequency divider 26 and the third frequency divider 28 may be disposed in parallel.

When the second frequency divider 26 performs a frequency dividing operation and the third frequency divider 28 halts a frequency dividing operation, the clock generation circuit generates the 4-phase output clocks CK0 to CK270. When the second and third frequency dividers 26 and 28 perform the frequency dividing operations, the clock generation circuit generates the 8-phase output clocks CK0 to CK315.

When the select signal is set to the 4-phase mode, for example, "0", the first selector 22 selects and supplies the intermediate clocks CKA0 and CKA180 to the third frequency divider 26. When the 4-phase/8-phase switching signal 4ph/8ph is set to the 4-phase mode, for example, "0", the second selector 24 selects a power source VDD (High level) and a ground GND (Low level), and when the 4-phase/8-phase switching signal 4ph/8ph is set to the 8-phase mode, for example, "1", the second selector 24 selects the intermediate clocks CKA90 and CKA270. When the 4-phase/8-phase switching signal 4ph/8ph is set to the 4-phase "0", the second selector 24 selects a high level value or a low level value. Therefore, the third frequency divider 28 halts the frequency dividing operation, and enters a low-power consumption mode state. When the 4-phase/8-phase switching signal 4ph/8ph is set to the 8-phase, for example, "1", the second selector 24 selects and outputs the intermediate clocks CKA90 and CKA270 to the third frequency divider 28. Therefore, the third frequency divider 28 performs the frequency dividing operation.

Since the select signal is set to "0", the first selector 22 may not select. The first selector 22 may be provided so that the timing of the output clock generated by the second frequency divider 26 coincides with the timing of the output clock generated by the third frequency divider 28. In the same way as the second selector 24, the first selector 22 includes two input terminals for a power source VDD (High level) and a ground GND (Low level) and a select signal terminal. Since delay characteristics based on the first selector 22 and the second selector 24 substantially coincide with each other, the timings of clocks generated by the second frequency divider 26 and the third frequency divider 28 match each other.

For example, in FIG. 3 and FIG. 4, when the 4-phase/8-phase switching signal 4ph/8ph is set to "0" of the 4-phase mode, the third frequency divider 28 may be halted and the second frequency divider 26 may output the 4-phase clocks CK0, CK90, CK180, and CK270, in the clock generation circuit 10 illustrated in FIG. 4. In a single-phase signal configuration, the clocks CK0 and CK90 are supplied to the mixer circuits MIXi and MIXq illustrated in FIG. 3, and in a differential signal configuration, the clocks CK0 and CK180 and the clocks CK90 and CK270 are supplied to the mixer circuits MIXi and MIXq. The mixer circuits MIXi and MIXq perform normal mixing.

When the 4-phase/8-phase switching signal 4ph/8ph is set to "1" of the 8-phase, the first, second, and third frequency dividers 20, 26, and 28 operate in the clock generation circuit 10 illustrated in FIG. 4. The second frequency divider 26 outputs the 4-phase clocks CK0, CK90, CK180, and CK270, and the third frequency divider 28 outputs the 4-phase clocks CK45, CK135, CK225, and CK315. In a differential signal configuration, the clocks CK0/CK180, CK45/CK225, and CK90/CK270 are supplied to the mixer circuit MIXi illustrated in FIG. 3, and the clocks CK90/CK270, CK135/CK315, and CK180/CK0 are supplied to the mixer circuit MIXq. The mixer circuit MIXq performs mixing, as a harmonic-rejection mixer circuit. After output signals IF_I and IF_q subjected to mixing pass through low-pass filters, the components of interfering waves corresponding to the third-order or fifth-order frequencies of clocks included in the output signal IF_I and IF_q may be reduced.

Figure 5A:
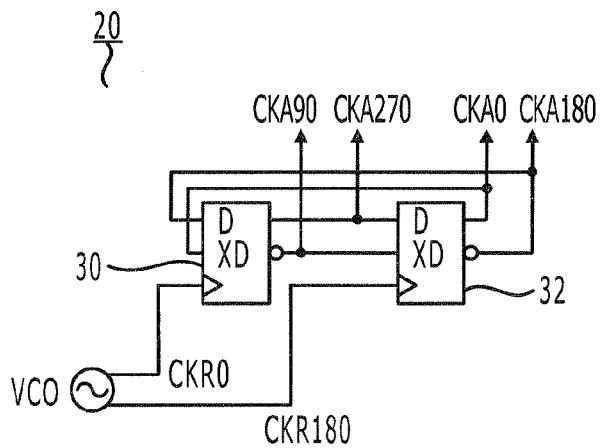
FIG. 5A to FIG. 5C illustrate an exemplary frequency divider.
Figure 5B:
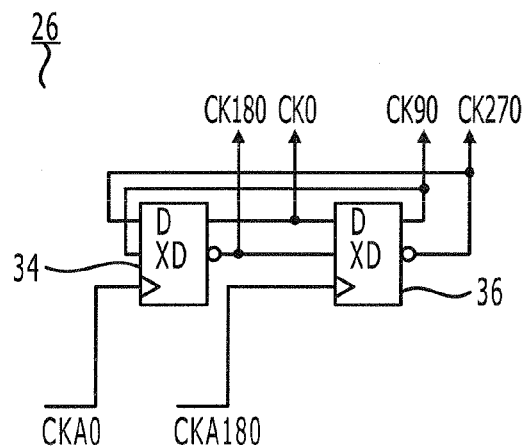
Figure 5C:
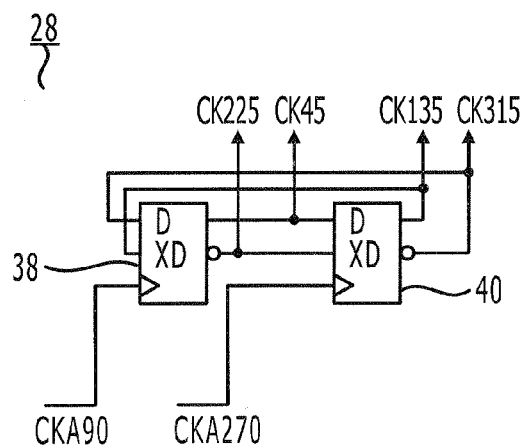

FIGS. 5A to 5C illustrate an exemplary frequency divider. Frequency dividers illustrated in FIGS. 5A to 5C may be included in the clock generation circuit. A differential signal may be input or output. A first frequency divider 20 illustrated in FIG. 5A includes flip-flops 30 and 32 having clock terminals which is supplied with the differential reference clocks CKR0 and CKR180 generated by the voltage-controlled oscillator VCO. The differential outputs of the flip-flop 30 are input to the differential data inputs of the flip-flop 32, respectively, and the differential outputs of the flip-flop 32 are input to the differential data inputs of the flip-flop 30 with being inverted, respectively. The first frequency divider 20 frequency-divides in synchronization with the reference clocks CKR0 and CKR180. The flip-flop 30 outputs the intermediate clocks CKA90 and CKA270, and the flip-flop 32 outputs the intermediate clocks CKA0 and CKA180.

The second frequency divider 26 illustrated in FIG. 5B includes flip-flops 34 and 36 coupled in a ring shape. The flip-flop 34 latches an input signal in synchronization with the intermediate clock CKA0, and the flip-flop 36 latches an input signal in synchronization with the intermediate clock CKA180. The flip-flop 34 outputs the clocks CK0 and CK180, and the flip-flop 36 outputs the clocks CK90 and CK270.

A third frequency divider 28 illustrated in FIG. 5C also includes flip-flops 38 and 40 coupled in a ring shape. The flip-flop 38 latches an input signal in synchronization with the intermediate clock CKA90, and the flip-flop 40 latches an input signal in synchronization with the intermediate clock CKA270. The flip-flop 38 outputs the clocks CK45 and CK225, and the flip-flop 40 outputs the clocks CK135 and CK315. When the intermediate clocks CKA90 and CKA270 do not change, each of the flip-flops 38 and 40 does not latch the input signal thereof, and hence the third frequency divider 28 may not frequency-divide.

Figure 6:
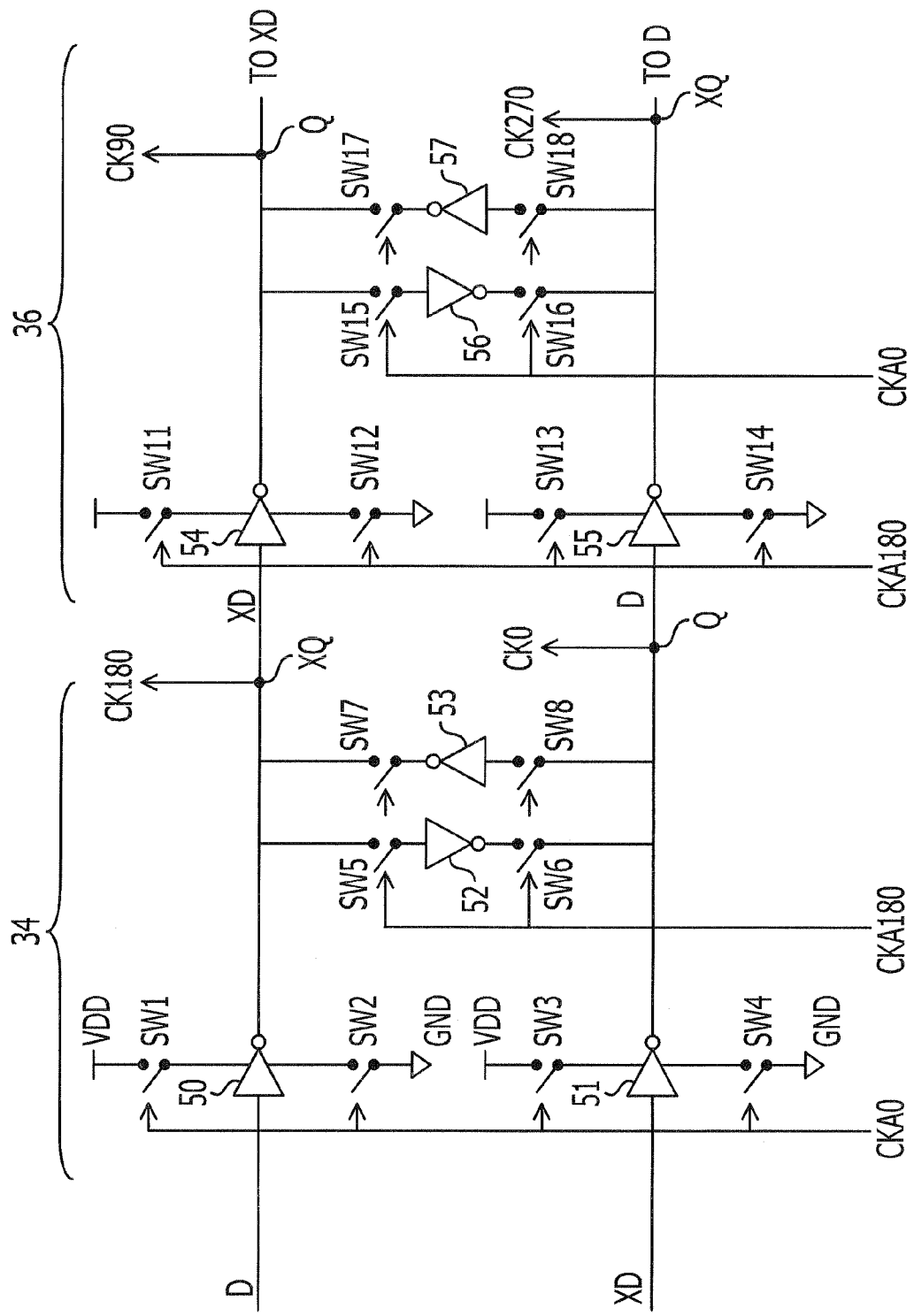
FIG. 6 illustrates an exemplary frequency divider.

FIG. 6 illustrates an exemplary frequency divider. A frequency divider in FIG. 6 may be the second frequency divider 26. The first frequency divider 20 and the third frequency divider 28 may be substantially equal to or similar to the second frequency divider 26 illustrated in FIG. 6. In the first frequency divider 20 and the third frequency divider 28, the phases of the intermediate clock CKA and the output clock CK may be different from each other.

The flip-flop 34 of the frequency divider 26 includes an input circuit including an inverter 50 coupled to the power source VDD and the ground GND through switches SW1 and SW2 controlled by the intermediate clock CKA0, respectively, and an inverter 51 coupled to the power source VDD and the ground GND through switches SW3 and SW4, respectively, and a latch circuit including inverters 52 and 53. The inverters in the latch circuit are coupled through switches SW5 to SW8 controlled by the clock CKA180 whose phase is opposite to the phase of the intermediate clock CKA0.

When the clock is at a high level, the switch enters a conductive state, and when the clock at a low level, the switch enters a non-conductive state. In the flip-flop 34, when the clock CKA0 at a high level, for example, CKA180=Low, signals of input terminals D and XD are latched, and when the clock CKA0 at a low level, for example, CKA180=High, the captured signals are latched.

The flip-flop 36 may be substantially the same or a similar flip-flop as the flip-flop 34. The input circuits of the inverter 54 and 55 latch signals of input terminals D and XD in synchronization with a high level of the intermediate clock CKA180, for example, CKA0=Low, and when the CKA180 has a low level, for example, CKA0=High, the latch circuits of the inverters 56 and 57 latch the latched signals.

The output terminal Q or XQ of the flip-flop 34 is coupled to the input terminal D or XD of the flip-flop 36. The output terminal Q or XQ of the flip-flop 36 is coupled to the input terminal XD or D of the flip-flop 34. A ring oscillator includes the flip-flops 34 and 36. CK0, CK90, CK180, and CK270 of the 8-phase clocks are generated at the output terminals Q and XQ of the flip-flops 34 and 36.

Figure 7:
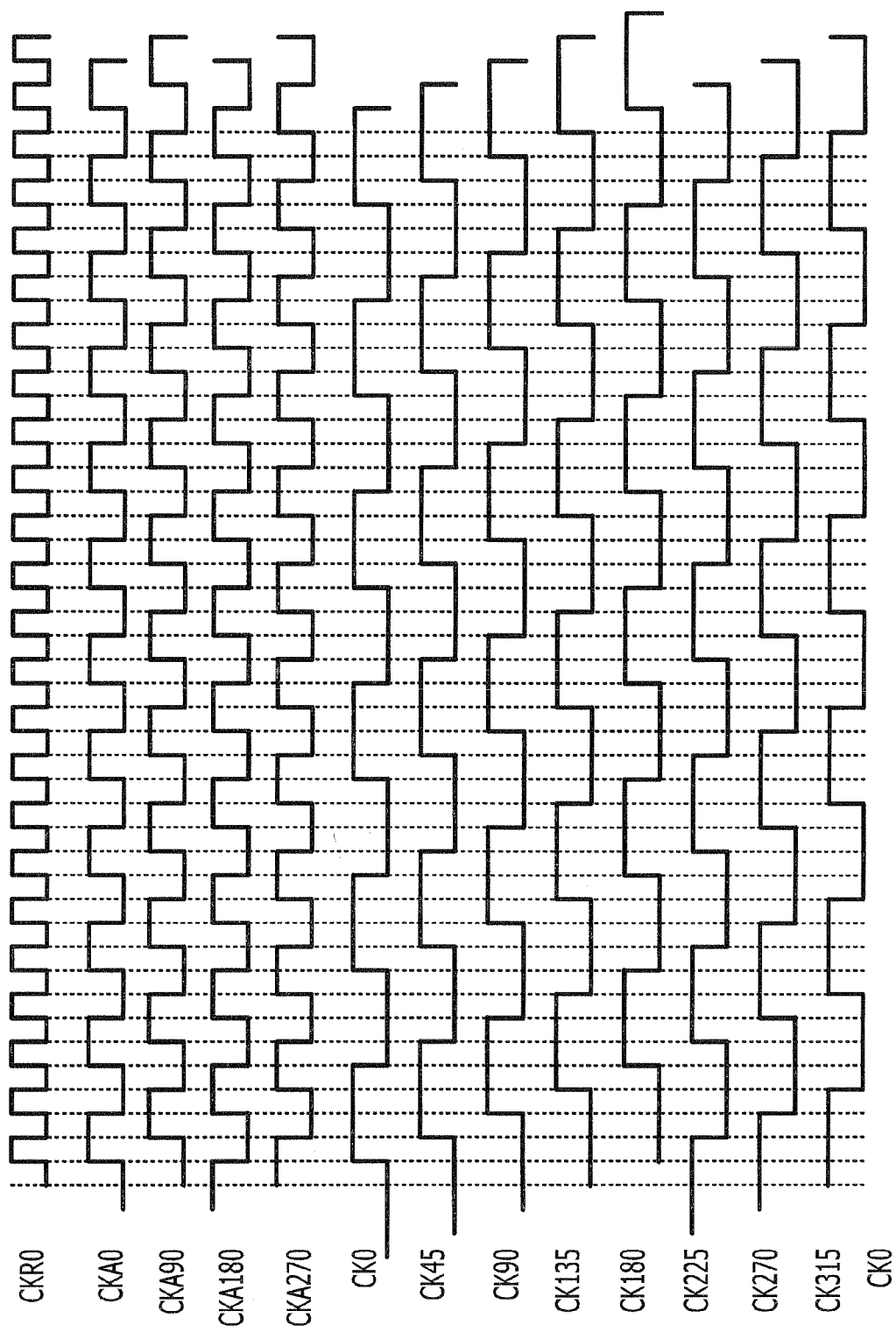
FIG. 7 illustrates an exemplary operation waveform of a clock generation circuit.

FIG. 7 illustrates an exemplary operation waveform of a clock generation circuit. The operation waveform of a local clock generation circuit illustrated in FIG. 7 may be the operation waveform of the local clock generation circuit illustrated in FIG. 4. The 4-phase intermediate clocks CKA0 to CKA270 are generated based on the reference clock CKR180 not illustrates and the reference clock CKR0. The 8-phase clocks CK0 to CK315 are generated based on the intermediate clocks CKA0 to CKA270. The frequency of the intermediate clock may be half the frequency of the reference clock, and the frequency of the clock may be half the frequency of the intermediate clock.

Since the frequency of the intermediate clock is half the frequency of the reference clock, the phases 0 degrees and 90 degrees of the intermediate clock may correspond to the 0 degrees and 180 degrees of the reference clock. Since the frequency of the output clock is half the frequency of the intermediate clock, the phases 0 degrees, 45 degrees, 90 degrees, 135 degrees, and 180 degrees of the output clock may correspond to the 0 degrees, 90 degrees, 180 degrees, and 270 degrees of the intermediate clock.

Figure 8A:
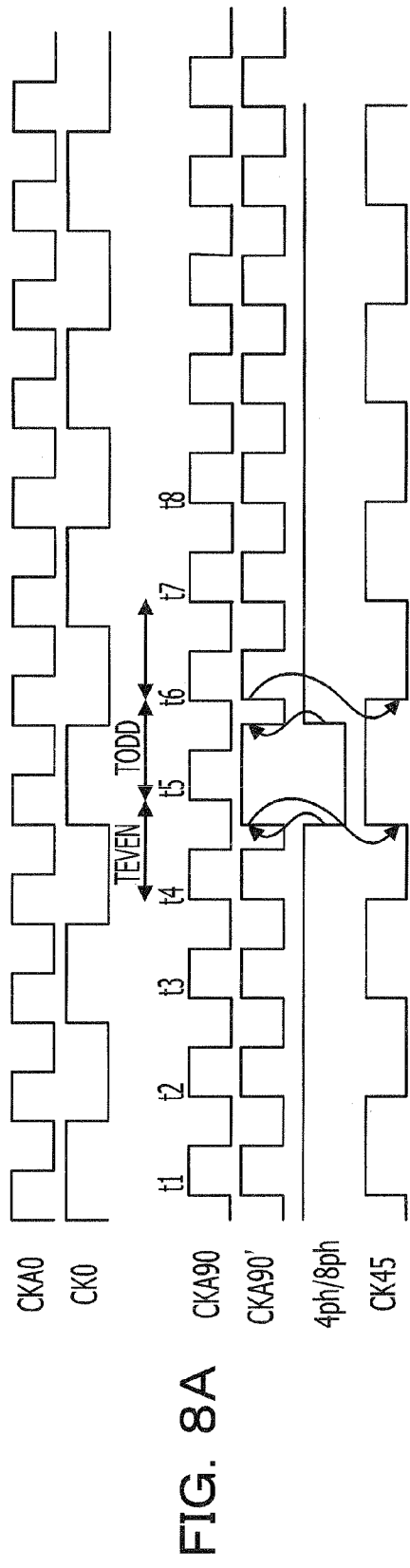
FIG. 8A and FIG. 8B illustrate an exemplary operation waveform of a clock generation circuit.
Figure 8B:
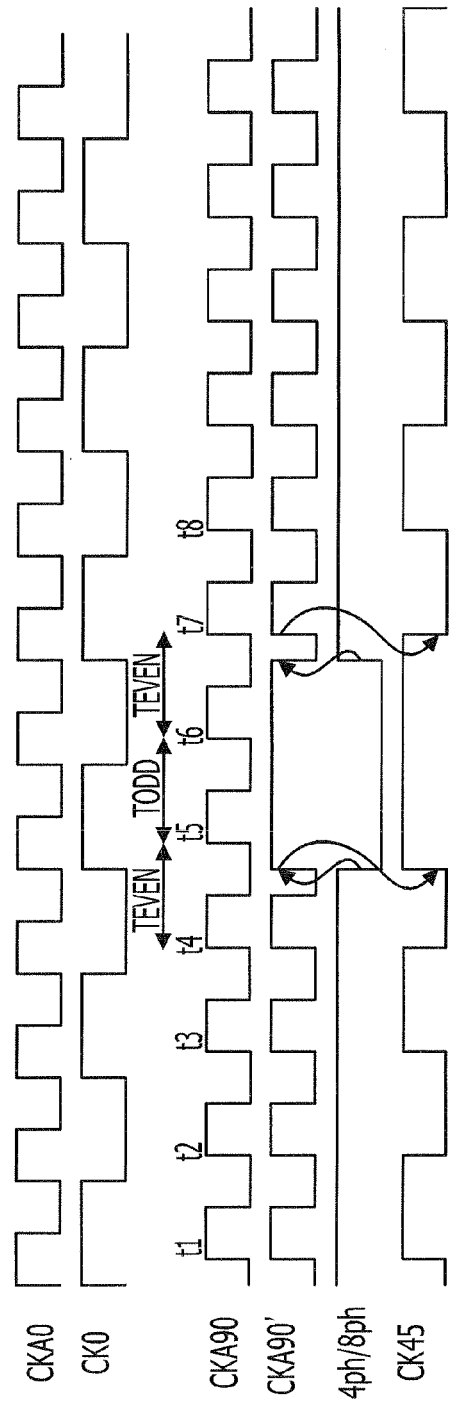

FIGS. 8A and 8B illustrate an exemplary operation waveform of a clock generation circuit. The operation waveforms of the clock generation circuit, illustrated in FIG. 8A and FIG. 8B, may be the operation waveforms of the clock generation circuit illustrated in FIG. 4. In the clock generation circuit illustrated in FIG. 4, when the 4-phase/8-phase switching signal 4ph/8ph is "0" of the 4-phase mode, for example, at a low level, the selector 24 selects a high level and a low level, the third frequency divider 28 is halted, and the second frequency divider 26 generates the 4-phase clocks CK0 to CK270. When the 4-phase/8-phase switching signal 4ph/8ph is "1" of the 8-phase mode, for example, at a high level, the selector 24 selects the intermediate clocks CKA90 and CKA270, the third frequency divider 28 frequency-divides, and the two frequency dividers 26 and 28 generate the 8-phase clocks CK0 to CK270 and the 8-phase clocks CK45 to CK315, respectively.

In FIG. 8A and FIG. 8B, the phase of the clock CK0 may be synchronous with the phase of the intermediate clock CKA0, and the frequency of the clock CK0 may be half the frequency of the intermediate clock CKA0. The phase of the clock CK45 may be synchronous with the phase of the intermediate clock CKA90, and the frequency of the clock CK45 may be half the frequency of the intermediate clock CKA90. When the 4-phase/8-phase switching signal 4ph/8ph is "0" of the 4-phase mode, for example, at a low level, the output of the selector 24 is at a high level, and the clock CK45 is inverted. When the 4-phase/8-phase switching signal 4ph/8ph is "1" of the 8-phase mode, for example, at a high level, the selector 24 outputs the intermediate clocks CKA90 and CKA270 with the timing, and the clock CK45 is inverted at the rising timing of the intermediate clock CKA90.

During odd periods Todd and even periods Teven after the rising edges t1 to t8 of the intermediate clock CK90 appear, the clock CK45 is alternately turned into a high level and a low level.

In FIG. 8A and FIG. 8B, when the intermediate clock CKA90 is at a low level, the 4-phase/8-phase switching signal 4ph/8ph is at a low level, and the clock CK45 is at a high level. In FIG. 8A, a timing when the 4-phase/8-phase switching signal 4ph/8ph is at a high level may be the odd period Todd. In FIG. 8B, a timing when the 4-phase/8-phase switching signal 4ph/8ph is at a high level may be the even period Teven.

As illustrated in FIG. 8A, when the 4-phase/8-phase switching signal 4ph/8ph is switched to the 8-phase within the odd period Todd, the clock CK45 turns into a low level at the rising edge of the intermediate clock CKA90 at the time t6, and turns into a high level at the time t7. The phase of the clock CK45 may be substantially equal to the phase of 45 degrees of the clock CK0. The third frequency divider 28 may generate the output clocks CK45, CK135, CK225, and CK315 of the second group, which have a certain phase relationship with the output clocks CK0, CK90, CK180, and CK270 of the first group. The certain relationship may be a normal relationship.

As illustrated in FIG. 8B, when the 4-phase/8-phase switching signal 4ph/8ph is switched to the 8-phase within the even period Teven, the clock CK45 turns into a low level at the rising edge of the intermediate clock CKA90 at the time t7, and turns into a high level at the time t8. The phase of the clock CK45 may be substantially equal to the phase of 135 degrees of the clock CK0. The third frequency divider 28 may generate the output clocks CK45, CK135, CK225, and CK315 of the second group, which have a certain phase relationship with the output clocks of the first group. The certain relationship may be an abnormal relationship.

If the 4-phase/8-phase switching signal 4ph/8ph turns into a low level when the intermediate clock CKA90 is at a high level, the clock CK45 is not inverted. Therefore, the third frequency divider 28 may generate the clock at an inadequate phase when a timing at which the 4-phase/8-phase switching signal 4ph/8ph turns into a high level corresponds to the even period, or the third frequency divider 28 may generate the clock at an inadequate phase when a timing at which the 4-phase/8-phase switching signal 4ph/8ph turns into a high level corresponds to the odd period.

In the clock generation circuit illustrated in FIG. 4, the third frequency divider 28 may generate the output clock at a adequate phase or generate the output clock at an inadequate phase, in accordance with the timing at which the 4-phase/8-phase switching signal 4ph/8ph is switched to the 8-phase mode.

In the clock generation circuit, the third frequency divider 28 may generate the clock whose phase is adequate, regardless of the timing of the 4-phase/8-phase switching signal 4ph/8ph.

Figure 9:
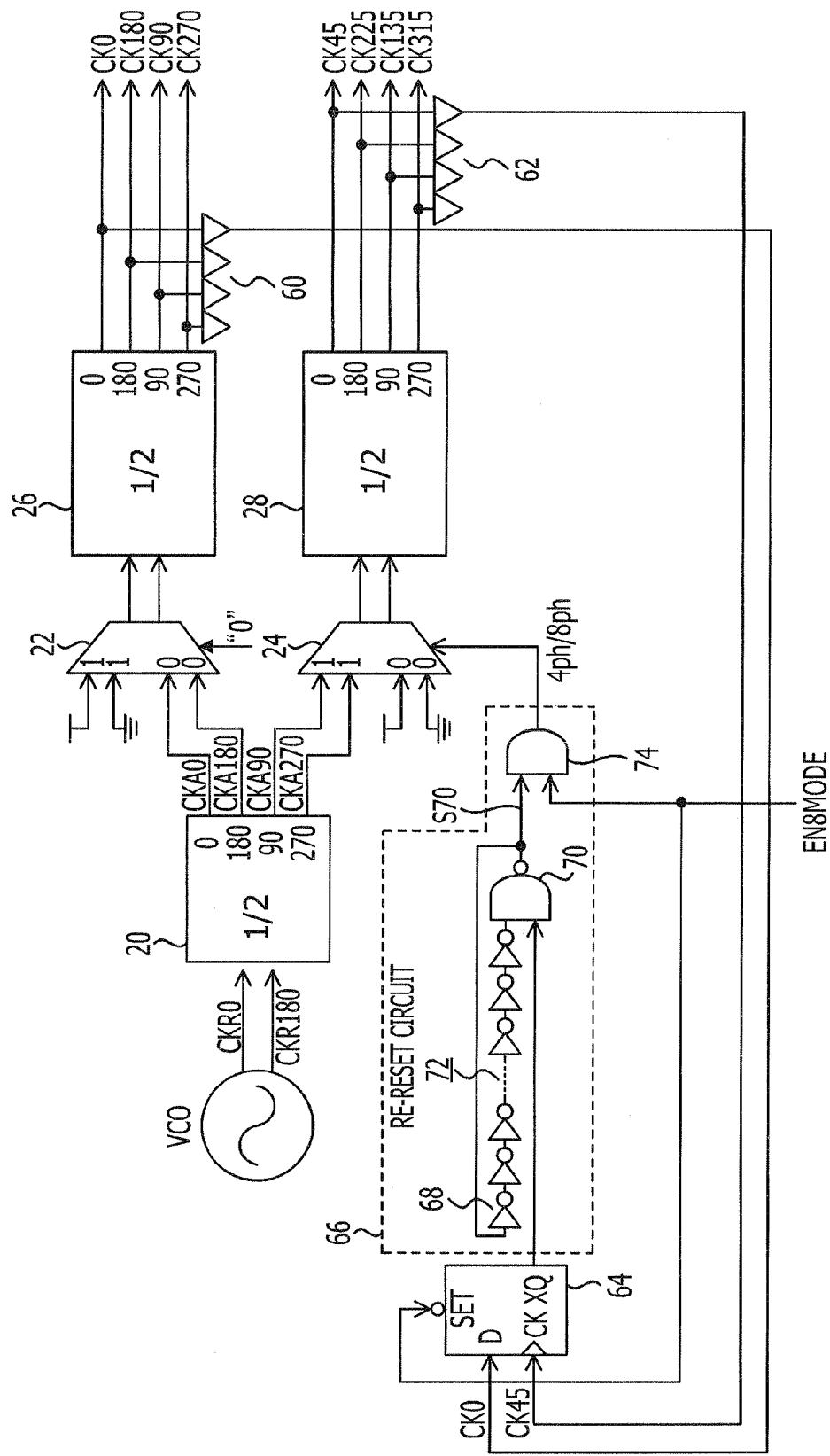
FIG. 9 illustrates an exemplary clock generation circuit.

FIG. 9 illustrates an exemplary clock generation circuit. The clock generation circuit includes a voltage-controlled oscillator VCO that generates the reference clocks CKR0 and CKR180, a first 1/2 frequency divider 20 that generates the intermediate clock CKA0, CKA90, CKA180, or CKA270 respectively corresponding to the phase of 0 degrees, 90 degrees, 180 degrees, or 270 degrees, in synchronization with the reference clock CKR0 or CKR180, a second 1/2 frequency divider 26 that generates the output clocks CK0, CK90, CK180, and CK270 of the first group, which respectively correspond to the phases of 0 degrees, 90 degrees, 180 degrees, and 270 degrees, in synchronization with the intermediate clock CKA0 corresponding to 0 degrees or the intermediate clock CKA180 corresponding to 180 degrees, a third 1/2 frequency divider 28 that generates the output clocks CK45, CK135, CK225, and CK315 of the second group, which respectively correspond to the phases of 45 degrees, 135 degrees, 225 degrees, and 315 degrees, in synchronization with the intermediate clock CKA90 corresponding to 90 degrees or the intermediate clock CKA270 corresponding to 270 degrees, and selectors 22 and 24.

The selector 24 is disposed between the first frequency divider 20 and the third frequency divider 28, and supplies the intermediate clock CKA90 corresponding to 90 degrees and the intermediate clock CKA270 corresponding to 270 degrees, or certain differential signals, for example, a high-level signal and a low-level signal, to the third frequency divider 28, in accordance with the 4-phase/8-phase switching signal 4ph/8ph. The selector 22 is disposed between the first frequency divider 20 and the second frequency divider 26, and supplies the intermediate clock CKA0 corresponding to 0 degrees and the intermediate clock CKA180 corresponding to 180 degrees to the second frequency divider 26 regardless of the 4-phase/8-phase switching signal 4ph/8ph. In the same way as the selector 24, the selector 22 includes an input terminal to which a high-level signal or a low-level signal is supplied and a circuit that selects an input terminal in accordance with a select signal, and may have substantially the same or a similar delay characteristic as that of the selector 24. The selector 22 may not select an input terminal, and may be a dummy selector having substantially the same or a similar circuit configuration as the circuit configuration of the selector 24.

The clock generation circuit may include an error detection circuit 64 that detects whether or not there is an error in a phase relationship between the output clock of the first group and the output clock of the second group, when a supplied 4-phase/8-phase switching signal EN8MODE indicates the 8-phase mode, for example, is a high level. The output clock of the first group may be the CK0, for example, and the output clock of the second group may be the CK45, for example. When the CK45 changes to a high level after the CK0 has changed to a high level, a normal phase relationship, for example, a relationship illustrated in FIG. 8A, may be set. When the CK45 changes to a high level after the CK0 has changed to a low level, an erroneous phase relationship, for example, a relationship illustrated in FIG. 8B, may be set.

As illustrated in FIGS. 8A and 8B, the output clocks of the first and second groups may have a normal phase relationship or an erroneous phase relationship in accordance with the timing of the 8-phase mode of the 4-phase/8-phase switching signal 4ph/8ph input to the selector 24. When the combination of the output clock of the first group and the output clock of the second group is a combination other than the combination of CK0 and CK45, two states may be detected.

The clock generation circuit may include a re-reset circuit 66 that outputs the 4-phase/8-phase switching signal 4ph/8ph of the 8-phase mode to the selector 24 at a timing, which is asynchronous with the reference clock, when the error detection circuit 64 detects an error, for example, XQ=High is satisfied. When the supplied 4-phase/8-phase switching signal EN8MODE is switched to a signal indicating the 8-phase mode, for example, a high level, the re-reset circuit 66 outputs, to the selector 24, the 4-phase/8-phase switching signal 4ph/8ph indicating the 8-phase mode, for example, an high level, thereby the third frequency divider 28 starting operating. While the supplied 4-phase/8-phase switching signal EN8MODE indicates the 8-phase mode, for example, is a high level, the re-reset circuit 66 outputs, to the selector 24, the 4-phase/8-phase switching signal 4ph/8ph at timing, which is asynchronous with the reference clock, when the error detection circuit 64 detects an error, and repeats an operation for switching from the 4-phase mode to the 8-phase mode until the third frequency divider 28 generates the output clock having an adequate phase. An operation for resetting to the 8-phase mode may be repeated.

The output clock CK0 of the first group is supplied to the data input terminal of the error detection circuit 64, and the output clock CK45 of the second group is supplied to the clock input terminal CK thereof. When CK0=High is satisfied at the timing of CK45=High, the error detection circuit 64 outputs a normal state XQ=Low, and outputs an erroneous state XQ=High.

The re-reset circuit 66 includes an oscillator 72 including an inverter group 68, an even-number of inverters, and a NAND gate 70. While the error detection state XQ=HIGH occurs, the oscillator 72 oscillates a signal which is in synchronization with the reference clock CKR. The frequency of the signal is lower than the frequency of the output clock of the first group. The oscillator 72 may not oscillate during the normal state XQ=Low, and a signal S70 is set to a high level. The AND gate 74 outputs the supplied 4-phase/8-phase switching signal EN8MODE to the selector 24, as the 4-phase/8-phase switching signal 4ph/8ph. The oscillator 72 oscillates during the erroneous state XQ=High. The re-reset signal S70 generated in asynchronization with the reference clock is output from the AND gate 74 to the selector 24, as the 4-phase/8-phase switching signal 4ph/8ph.

The output clocks of the second and third frequency dividers 26 and 28 are input to the buffers 60 and 62, respectively, and the delay characteristics of the output clocks CK0 to CK315 may be set so that they becomes substantially equal or similar to one another.

Figure 10:
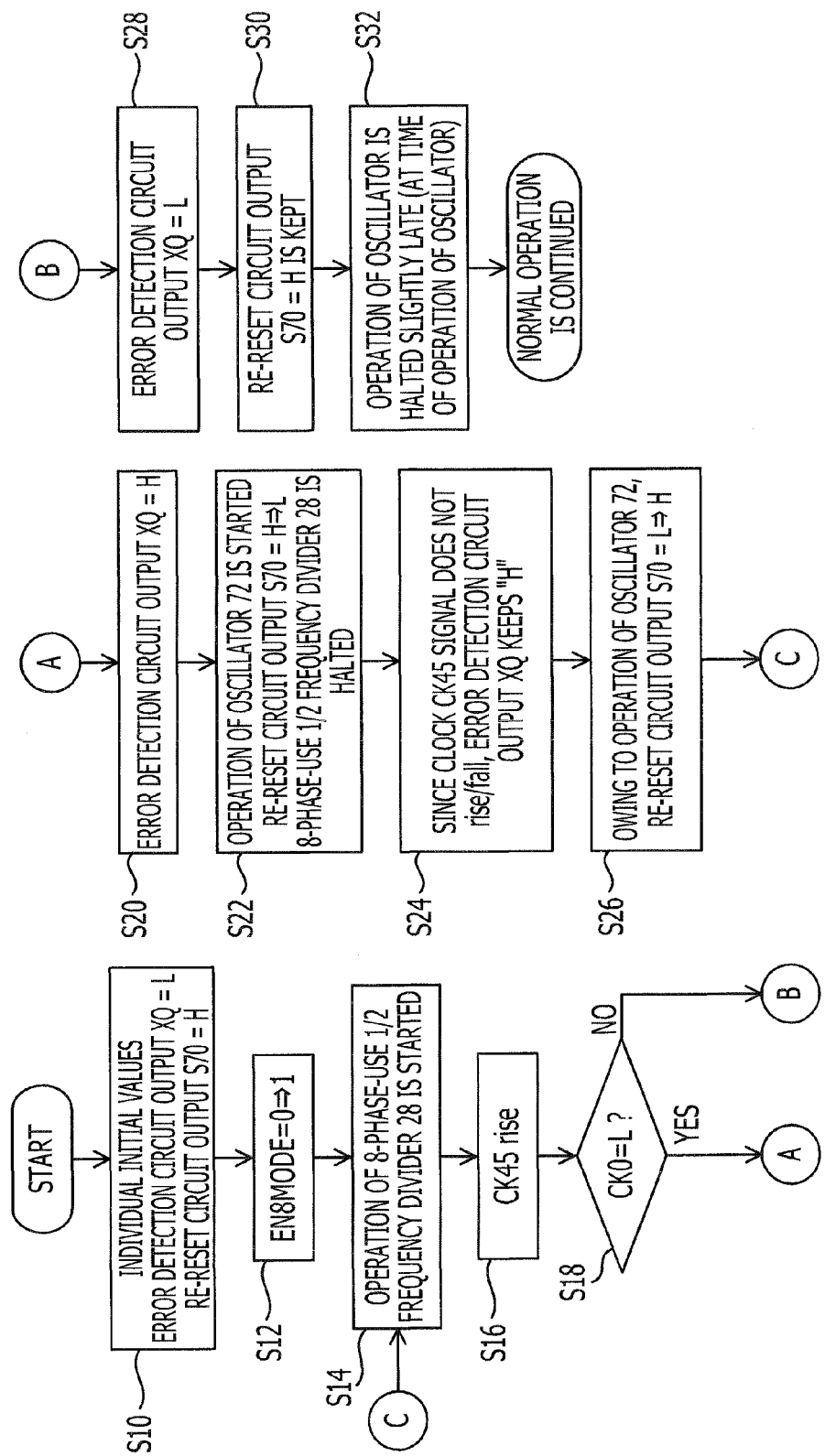
FIG. 10 illustrates an exemplary clock generation circuit.

FIG. 10 illustrates an exemplary operation of a clock generation circuit.

The error detection circuit 64 is set by a signal indicating the 4-phase mode of the supplied 4-phase/8-phase switching signal EN8MODE, for example, a low-level signal, is initialized, and when the error detection output XQ is a low level, for example, indicates normality, the re-reset circuit output S70 that is the output S70 of the NAND gate 70 may turn into an high level (S10).

When the supplied 4-phase/8-phase switching signal EN8MODE turns into the 8-phase mode, for example, a high level (S12), the AND gate 74 of the re-reset circuit 66 passes the 4-phase/8-phase switching signal EN8MODE indicating the 8-phase mode, for example, an high-level signal, and outputs the 4-phase/8-phase switching signal EN8MODE indicating the 8-phase mode to the selector 24 as the 4-phase/8-phase switching signal 4ph/8ph. When the 4-phase/8-phase switching signal 4ph/8ph of the 8-phase mode (High level) is supplied to the selector 24, the selector 24 switches to the intermediate clocks CKA90 and CKA270 based on a certain signal of the differential signal, for example, a high-level signal or a low-level signal, and outputs the intermediate clocks CKA90 and CKA270 to the third frequency divider 28. The third frequency divider 28 starts the generation of the output clocks CK45 to CK315 of the second group (S14).

In response to the rising of the output clock CK45 (S16), the error detection circuit 64 detects whether the output clock CK0 is a high level or a low level (S18). When the phase is normal, the error detection signal XQ is set to a low level, and when the phase is erroneous, the error detection signal XQ is set to a high level.

When the error detection signal XQ indicates an error (A), the error detection circuit output XQ turns into a high level (S20), and hence the oscillator 72 starts oscillating. When the output 570 of the re-reset circuit is switched from a high level to a low level, the selector 24 outputs certain differential signals, for example, a high-level signal and a low-level signal, and the third frequency divider 28 is halted (S22). Since the output clock CK45 does not change during this period, the error detection circuit output XQ maintains the error detection signal XQ indicating an error (S24). When the re-reset circuit output S70 is switched from a low level to a high level owing to the oscillation operation of the oscillator 72, the 4-phase/8-phase switching signal 4ph/8ph indicating the 8-phase mode, for example, a high-level signal, is supplied to the selector 24. A re-reset operation for resetting from the 4-phase mode to the 8-phase mode is performed.

As illustrated in C in FIG. 10, the third frequency divider 28 resumes the frequency dividing operation (S14). In response to CK45=High, the error detection circuit 64 checks whether or not the phase is normal or erroneous (S16, S18). A subsequent operation may be substantially the same or a similar operation as the above-mentioned operation.

Since the oscillator 72 in the re-reset circuit 66 generates a signal which is asynchronous with the reference clock CKR, a timing when the re-reset circuit output S70 turns form a high level to a low level for triggering re-resetting and a timing when the re-reset circuit output S70 turns form a low level to a high level may be asynchronous with the timings of the output clock CK0 to CK270 of the first group. Therefore, when the resetting of the third frequency divider 28 based on the re-reset circuit output S70 is repeated, the third frequency divider 28 may output the output clocks CK45 to CK315 having a normal phase relationship. When the output clock CK45 having a normal phase relationship is output, the error detection circuit 64 sets the output XQ to a low level (S28). The oscillator 72 in the re-reset circuit 66 may be halted, and the output S70 of the oscillator 72 may be maintained in a high level (S30).

Figure 11:
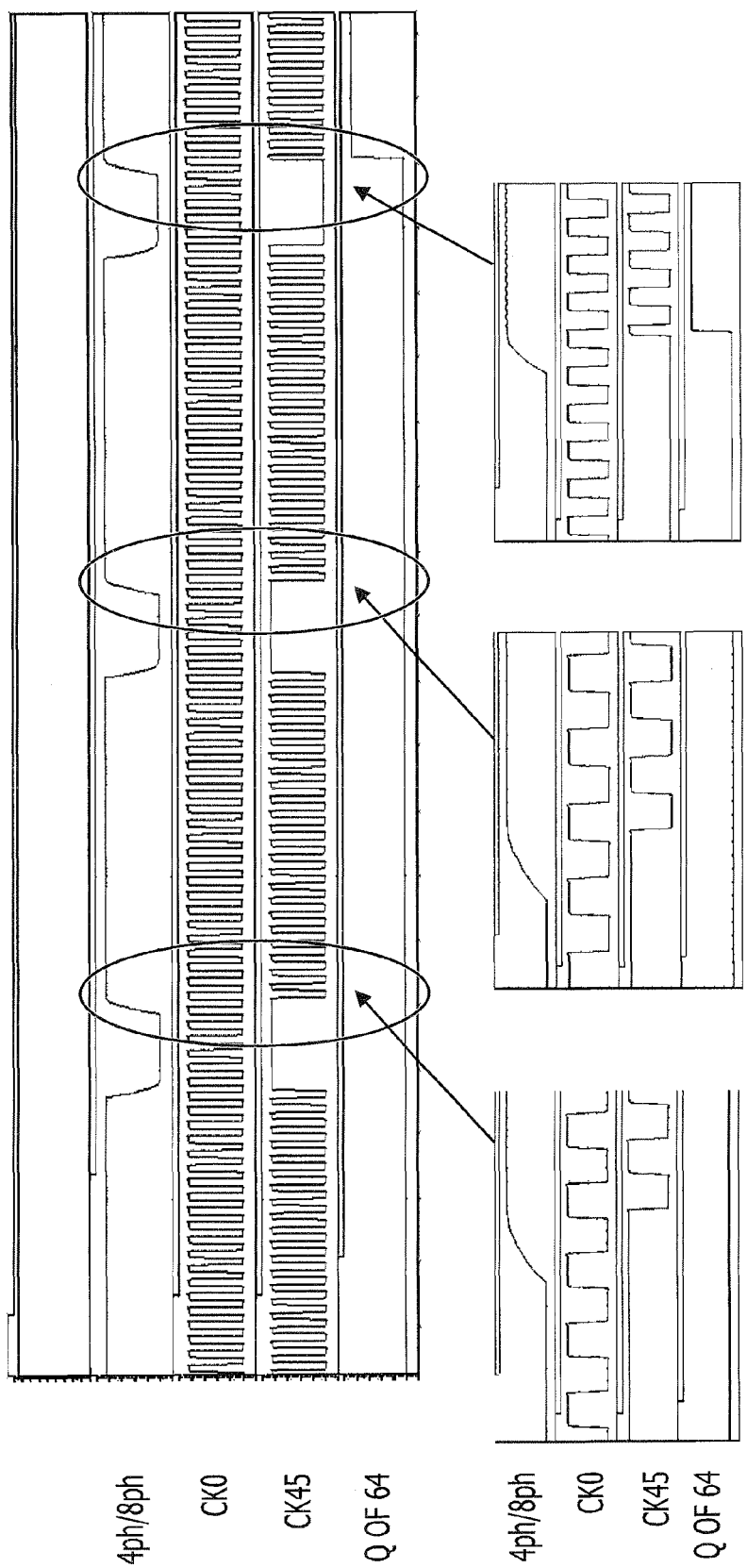
FIG. 11 illustrates an exemplary operation waveform of a clock generation circuit.

FIG. 11 illustrates an exemplary operation waveform of a clock generation circuit. The operation waveform illustrated in FIG. 11 may be a simulated waveform. In FIG. 11, the 4-phase/8-phase switching signal 4ph/8ph supplied to the selector 24, the output clocks CK0 and CK45, and the positive phase output Q of the error detection circuit 64 are illustrated. In response to the rising of the 4-phase/8-phase switching signal 4ph/8ph from a low level to a high level at a time t11, the third frequency divider 28 starts frequency-dividing. At the time t11, an error of a phase relationship between the output clocks CK0 and CK45 may be detected. In response to the rising of the 4-phase/8-phase switching signal 4ph/8ph from a low level to a high level at a time t12, the third frequency divider 28 starts frequency-dividing. At the time t12, an error of a phase relationship between CK0 and CK45 may be detected.

At a time t13, the third frequency divider 28 performs frequency dividing with a normal phase relationship, and the positive phase output Q of the error detection circuit 64 becomes high (XQ=L). The oscillator 72 in the re-reset circuit 66 may be halted, and the clock generation circuit may maintain the 8-phase mode state.

In the clock generation circuit, in response to the 4-phase/8-phase switching signal EN8MODE indicating the 8-phase mode, for example, an high-level signal, the third frequency divider 28 starts frequency dividing, and outputs the output clocks CK45 to CK315 of the second group. When an error of a phase relationship between the output clocks CK0 to CK270 of the first group and the output clocks CK45 to CK315 of the second group is detected, the re-reset circuit makes the 4-phase/8-phase switching signal 4ph/8ph toggle between a signal indicating the 4-phase mode, for example, a low-level signal and a signal indicating the 8-phase mode, for example, a high-level signal. The third frequency divider 28 may be reset to the 8-phase mode again. The re-resetting operation of the third frequency divider 28 may be repeated until a normal phase relationship between the output clocks is detected.

When an error of the phase relationship is detected at the switching from the 4-phase mode to the 8-phase mode, the clock generation circuit may be reset until a normal phase relationship is detected. When an error of the phase relationship due to a noise is detected, the clock generation circuit may be reset until a normal phase relationship.

Figure 12:
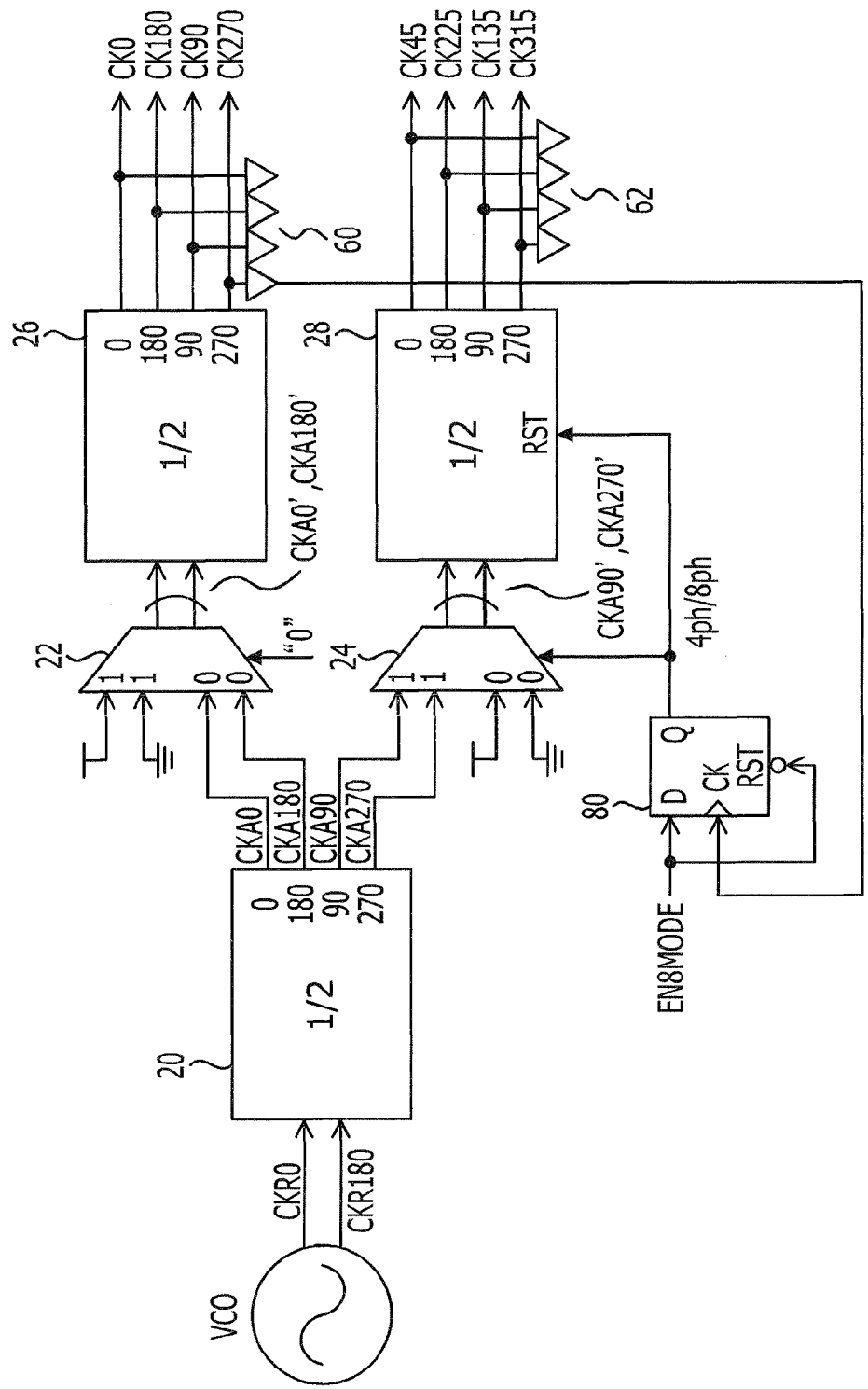
FIG. 12 illustrates an exemplary clock generation circuit.

FIG. 12 illustrates an exemplary clock generation circuit. The clock generation circuit includes the voltage-controlled oscillator VCO, the first, second, and third frequency dividers 20, 26, and 28, the selectors 22 and 24, and the buffer groups 60 and 62. The clock generation circuit includes a switching signal supply circuit 80. The switching signal supply circuit 80 outputs the 4-phase/8-phase switching signal EN8MODE to the selector 24 and the reset terminal RST of the third frequency divider 28 at timings of the output clocks CK0 to CK270 of the first group, and resets the third frequency divider.

The switching signal supply circuit 80 illustrated in FIG. 12 outputs the 4-phase/8-phase switching signal EN8MODE to the selector 24 in synchronization with the rising edge of the output clock CK270 a low level to a high level. One of the output clocks CK0 to CK270 may be selected based on a relationship between the frequency of the output clock and the operation delay time of one of the buffer 60, the switching signal supply circuit 80, and the selector 24.

Figure 13:
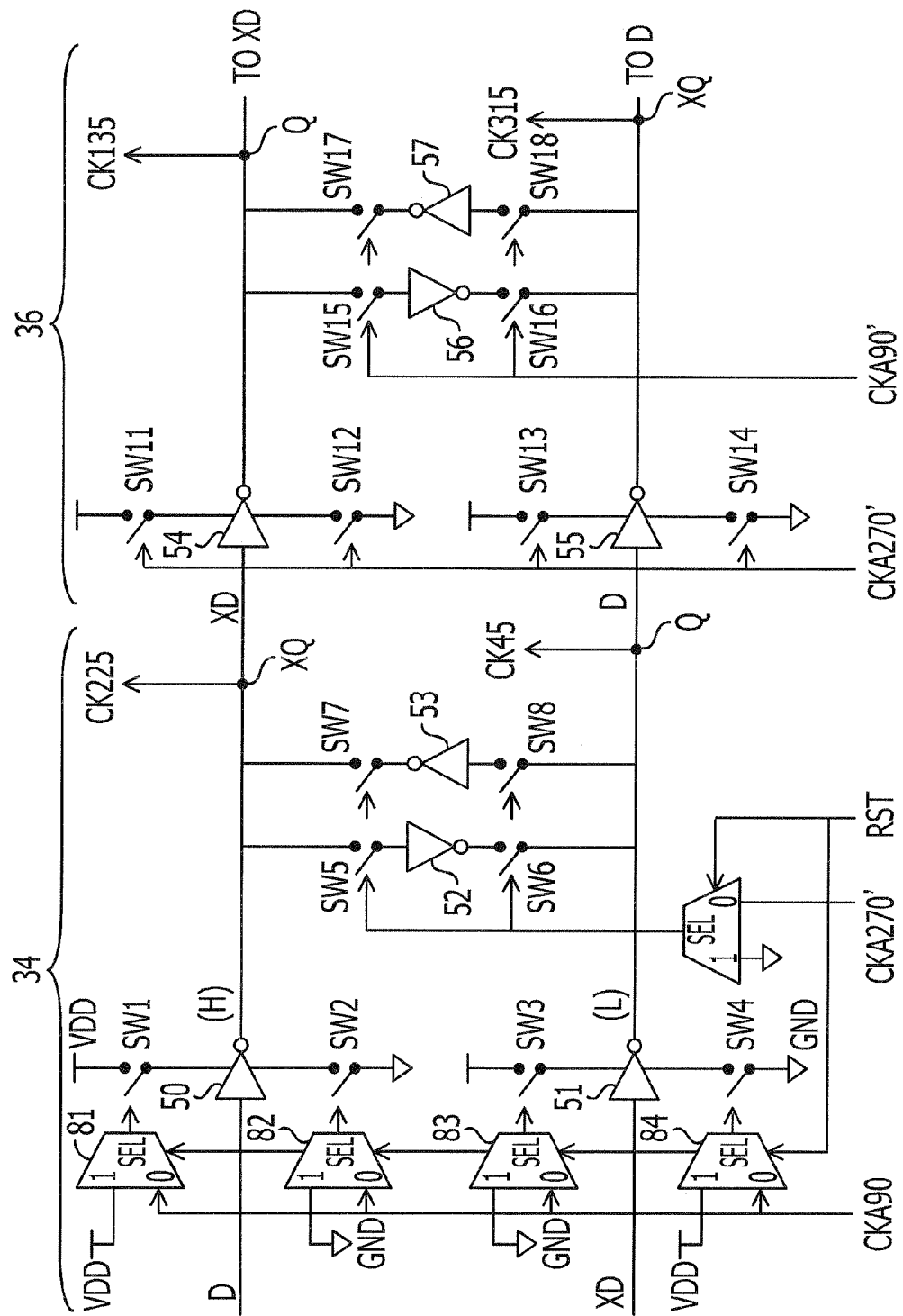
FIG. 13 illustrates an exemplary frequency divider.

FIG. 13 illustrates an exemplary frequency divider. A frequency divider illustrated in FIG. 13 may be the third frequency divider 28 illustrated in FIG. 4. The third frequency divider 28 includes a reset terminal RST. When a high-level signal is supplied to the reset terminal RST, the third frequency divider 28 is reset. The frequency divider illustrated in FIG. 13 may have a configuration in which selectors 81 to 85 are provided in the frequency divider illustrated in FIG. 6. When control signals are at a high level, switches SW1 to SW18 become conductive states, and when the control signals are at a low level, the switches SW1 to SW18 become non-conductive states.

When the reset terminal RST turns into a high level, for example, "1", the selector 81 selects VDD, for example, a high level, the selector 82 selects GND, for example, a low level, the inverter 50 outputs a high-level signal, and the inverter 51 outputs a low-level signal. The selector 85 selects GND, for example, an low-level signal. The switches SW5 to SW8 for the inverters 52 and 53 included in the latch circuit are turned off, and the latch circuit is reset.

Figure 14:
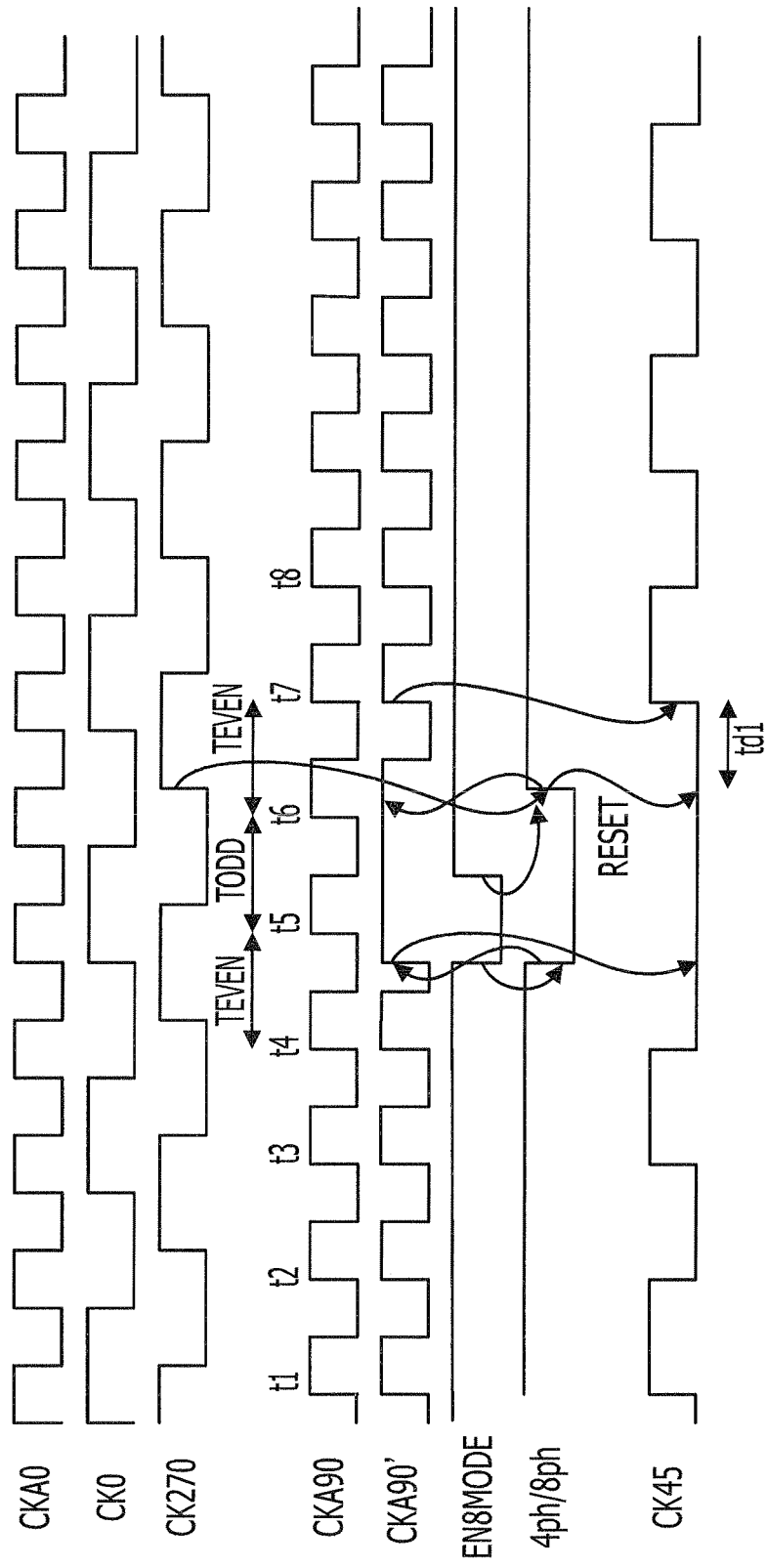
FIG. 14 illustrates an exemplary operation waveform of a clock generation circuit.

FIG. 14 illustrates an exemplary operation waveform of a clock generation circuit. The clock generation circuit illustrated in FIG. 12 may perform an operation illustrated in FIG.

14. When the clock CK270 from among the output clocks of the first group, generated by the second frequency divider 26, is at a high level, the switching signal supply circuit 80 supplies, to the selector 24, the 4-phase/8-phase switching signal EN8MODE indicating the 4-phase mode, for example, a low-level signal or the 4-phase/8-phase switching signal EN8MODE indicating the 8-phase mode, for example, a high-level signal, as the 4-phase/8-phase switching signal 4ph/8ph. When the 4-phase/8-phase switching signal 4ph/8ph indicates the 8-phase mode, for example, is at a high level, the third frequency divider 28 is reset.

At a timing between times t4 and t5, the 4-phase/8-phase switching signal EN8MODE is set to a low level. Since the output clock CK270 is at a high level, the switching signal supply circuit 80 sets the 4-phase/8-phase switching signal 4ph/8ph to a low level. Therefore, the frequency dividing operation of the third frequency divider 28 is halted. In FIG. 14, the output clock CK45 may be set to a low level based on the halt of the frequency dividing operation.

At a timing between times t5 and t6, the 4-phase/8-phase switching signal EN8MODE is set to a high level, and the switching signal supply circuit 80 outputs the 4-phase/8-phase switching signal 4ph/8ph that is at a high level, in synchronization with the rising edge of the clock CK270 subsequent to the time t6. The third frequency divider 28 may be reset and start frequency dividing, in response to the 4-phase/8-phase switching signal 4ph/8ph that is at a high level. The output clock CK45 may be rest to a low level based on resetting. The output clock CK45 is set to a high level in synchronization with the rising edge of the intermediate clock CKA90 at a time t7, the output clock CK45 rises in synchronization with the rising edges of the intermediate clock CKA90 at the nth t7, t9, . . . (n: odd number), and the output clock CK45 falls in synchronization with the rising edges of the intermediate clock CKA90 at the nth t8, . . . (n: even number).

The clock CK270 is selected as the output clock of the first group for setting the timing of the 4-phase/8-phase switching signal 4ph/8ph based on a clock speed, for example, a frequency and the delay characteristic td1 of a circuit. When switching to the 8-phase mode, the rising timing of the output clock CK45 may be matched to the starting time t7 of the nth period (n: odd number). The third frequency divider 28 may generate the output clocks CK45 to CK315 of the second group with a normal phase relationship.

When an error of a phase relationship between the output clocks CK45, CK135, CK225, and CK315 of the second group and the output clocks CK0 to CK270 of the first group is detected, a normal phase relationship may not be obtained.

In synchronization with the timings of the output clocks of the first group, the clock generation circuit illustrated in FIG. 12 supplies the 4-phase/8-phase switching signal EN8MODE indicating the 8-phase mode, for example, a high-level signal, to the selector 24 and the reset terminal of the third frequency divider 28. After resetting the output clock CK45 to a low level, the third frequency divider 28 may set the output clock CK45 to a high level at the timing of the starting time of an odd period of the intermediate clock CKA90, and start frequency dividing with a normal phase relationship.

Example embodiments of the present invention have now been described in accordance with the above advantages. It will be appreciated that these examples are merely illustrative of the invention. Many variations and modifications will be apparent to those skilled in the art.

The invention claimed is:
1. A multiphase clock generation circuit comprising:
a first frequency divider to generate a first intermediate clock and a second intermediate clock in synchronization with a reference clock;
a second frequency divider to generate output clocks of a first group including a first output clock and a second output clock in synchronization with the first intermediate clock;
a third frequency divider to generate output clocks of a second group including a third output clock and a fourth output clock in synchronization with the second intermediate clock;
a selector, provided between the first frequency divider and the third frequency divider, to supply one of the second intermediate clock and a value to the third frequency divider in response to a switching signal;
an error detection circuit to detect an error in a phase relationship between an output clock of the first group and an output clock of the second group when the switching signal indicates a first mode; and
a re-reset circuit to output the switching signal to the selector based on the error in asynchronous with the reference clock.
2. The multiphase clock generation circuit according to claim 1, wherein
the first intermediate clock has a phase of 0 degrees with respect to the reference clock, and
the second intermediate clock has a phase of 90 degrees with respect to the reference clock.
3. The multiphase clock generation circuit according to claim 1, wherein
the first output clock has a phase of 0 degrees with respect to the first intermediate clock,
the second output clock has a phase of 90 degrees with respect to the first intermediate clock,
the third output clock has a phase of 45 degrees with respect to the second intermediate clock, and
the fourth output clock has a phase of 135 degrees with respect to the second intermediate clock.
4. The multiphase clock generation circuit according to claim 1, wherein
the re-reset circuit outputs the switching signal to the selector when the switching signal is switched to the first mode, and when the switching signal is the first mode, the re-reset circuit outputs the switching signal to the selector at an asynchronous timing when the error detection circuit detects the error.
5. The multiphase clock generation circuit according to claim 4, wherein
the re-reset circuit includes an oscillator to generate a re-reset signal which is asynchronous with the reference clock, and
the re-reset circuit outputs the switching signal to the selector based on the re-reset signal when the error detection circuit detects the error.
6. The multiphase clock generation circuit according to claim 1, wherein
the error detection circuit detects the output clock of the first group in accordance with the output clock of the second group when the switching signal indicates the first mode.
7. The multiphase clock generation circuit according to claim 1, further comprising,
a dummy selector, provided between the first frequency divider and the second frequency divider, to supply the first intermediate clock to the second frequency divider.

8. The multiphase clock generation circuit according to claim 7, wherein
the dummy selector includes an input terminal to receive the value supplied by the selector.

9. The multiphase clock generation circuit according to claim 1, further comprising,
a buffer group to receive at least one of the output clock of the first group and the output clock of the second group.

10. The multiphase clock generation circuit according to claim 1, wherein
the first frequency divider generates a third intermediate clock and a fourth intermediate clock,
the second frequency divider generates a fifth output clock and a sixth output clock, and
the third frequency divider generates a seventh output clock and an eighth output clock.

11. A multiphase clock generation circuit comprising:
a first frequency divider to generate a first intermediate clock, a second intermediate clock, a third intermediate clock, and a fourth intermediate clock in synchronization with a reference clock;
a second frequency divider to generate output clocks of a first group including a first output clock and a second output clock in synchronization with the first intermediate clock;
a third frequency divider to generate output clocks of a second group including a third output clock and a fourth output clock in synchronization with the second intermediate clock;
a selector, provided between the first frequency divider and the third frequency divider, to supply one of the second intermediate clock, the fourth intermediate clock, and a value to the third frequency divider in response to a switching signal; and
a switching signal supply circuit to output the switching signal to the selector and a reset terminal of the third frequency divider based on the output clock of the first group.

12. The multiphase clock generation circuit according to claim 11, wherein
the first intermediate clock has a phase of 0 degrees with respect to the reference clock,
the second intermediate clock has a phase of 90 degrees with respect to the reference clock,
the third intermediate clock has a phase of 180 degrees with respect to the reference clock, and
the fourth intermediate clock has a phase of 270 degrees with respect to the reference clock.

13. The multiphase clock generation circuit according to claim 11, wherein
the first output clock has a phase of 0 degrees with respect to the first intermediate clock,
the second output clock has a phase of 90 degrees with respect to the first intermediate clock,
the third output clock has a phase of 45 degrees with respect to the second intermediate clock, and
the fourth output clock has a phase of 135 degrees with respect to the second intermediate clock.

14. The multiphase clock generation circuit according to claim 11, further comprising,
a dummy selector, provided between the first frequency divider and the second frequency divider, to supply the intermediate clock of 0 degrees to the second frequency divider.

15. The multiphase clock generation circuit according to claim 14, wherein
the dummy selector includes an input terminal to receive the value supplied by the selector.

16. The multiphase clock generation circuit according to claim 11, further comprising,
a buffer group to receive the output clock of the first group and the output clock of the second group.

17. The multiphase clock generation circuit according to claim 11, wherein
the second frequency divider generates a fifth output clock and a sixth output clock, and
the third frequency divider generates a seventh output clock and an eighth output clock.

* * * * *